(12) United States Patent  
Leutwein

(10) Patent No.: US 8,320,127 B2  
(45) Date of Patent: Nov. 27, 2012

(54) ELECTRONICS UNIT WITH COOLING FINS

(76) Inventor: Gerhard Leutwein, Künzelsau (DE)

( * ) Notice: Subject to any disclaimer, the term of this patent is extended or adjusted under 35 U.S.C. 154(b) by 174 days.

(21) Appl. No.: 12/859,946

(22) Filed: Aug. 20, 2010

(65) Prior Publication Data

US 2011/0051370 A1    Mar. 3, 2011

(30) Foreign Application Priority Data

Aug. 25, 2009    (DE) .......................... 10 2009 038 806

(51) Int. Cl.
*H05K 7/20*    (2006.01)

(52) U.S. Cl. ........ 361/695; 361/688; 361/689; 361/694; 361/697; 165/80.3; 165/185

(58) Field of Classification Search .................. None
See application file for complete search history.

(56) References Cited

U.S. PATENT DOCUMENTS

| | | | |
|---|---|---|---|
| 5,091,823 A * | 2/1992 | Kanbara et al. ............... | 361/697 |
| 5,909,358 A * | 6/1999 | Bradt ........................... | 361/707 |
| 5,940,272 A * | 8/1999 | Emori et al. .................. | 361/704 |
| 6,326,761 B1 * | 12/2001 | Tareilus ........................ | 318/722 |
| 6,359,779 B1 * | 3/2002 | Frank et al. .............. | 361/679.47 |
| 6,390,182 B1 * | 5/2002 | Sauer ........................... | 165/80.3 |
| 6,900,562 B2 * | 5/2005 | Derksen ...................... | 310/68 R |
| 7,027,938 B1 * | 4/2006 | Dister ............................. | 702/61 |
| 7,038,910 B1 * | 5/2006 | Hodge et al. ................. | 361/690 |
| 7,355,848 B1 * | 4/2008 | Hodge et al. ................. | 361/690 |
| 7,813,128 B2 * | 10/2010 | Marchand ..................... | 361/694 |
| 7,817,421 B2 * | 10/2010 | Nagatomo et al. ........... | 361/697 |
| 8,028,744 B2 * | 10/2011 | Kumar et al. ................ | 165/80.3 |
| 8,081,465 B2 * | 12/2011 | Nishiura ...................... | 361/703 |
| 2006/0171115 A1 | 8/2006 | Cramer | |
| 2008/0291632 A1 | 11/2008 | Bremicker et al. | |

* cited by examiner

*Primary Examiner* — Boris Chervinsky
(74) *Attorney, Agent, or Firm* — Hooker & Habib, P.C.

(57) ABSTRACT

The invention concerns a unit with electronic components, which, when in operation, generate heat. The unit comprises a carrier plate, upon the first section of which a first group of electronic components is placed. Upon a second section thereof is installed a plurality of cooling ribs for the removal of heat produced by the electronic components. The cooling ribs are designed to be curved to a predetermined extent along their longitudinal axis and to lie in a plane parallel to the said carrier plate.

18 Claims, 3 Drawing Sheets

ELECTRONICS UNIT WITH COOLING FINS

SCOPE OF THE INVENTION

Figure 1:
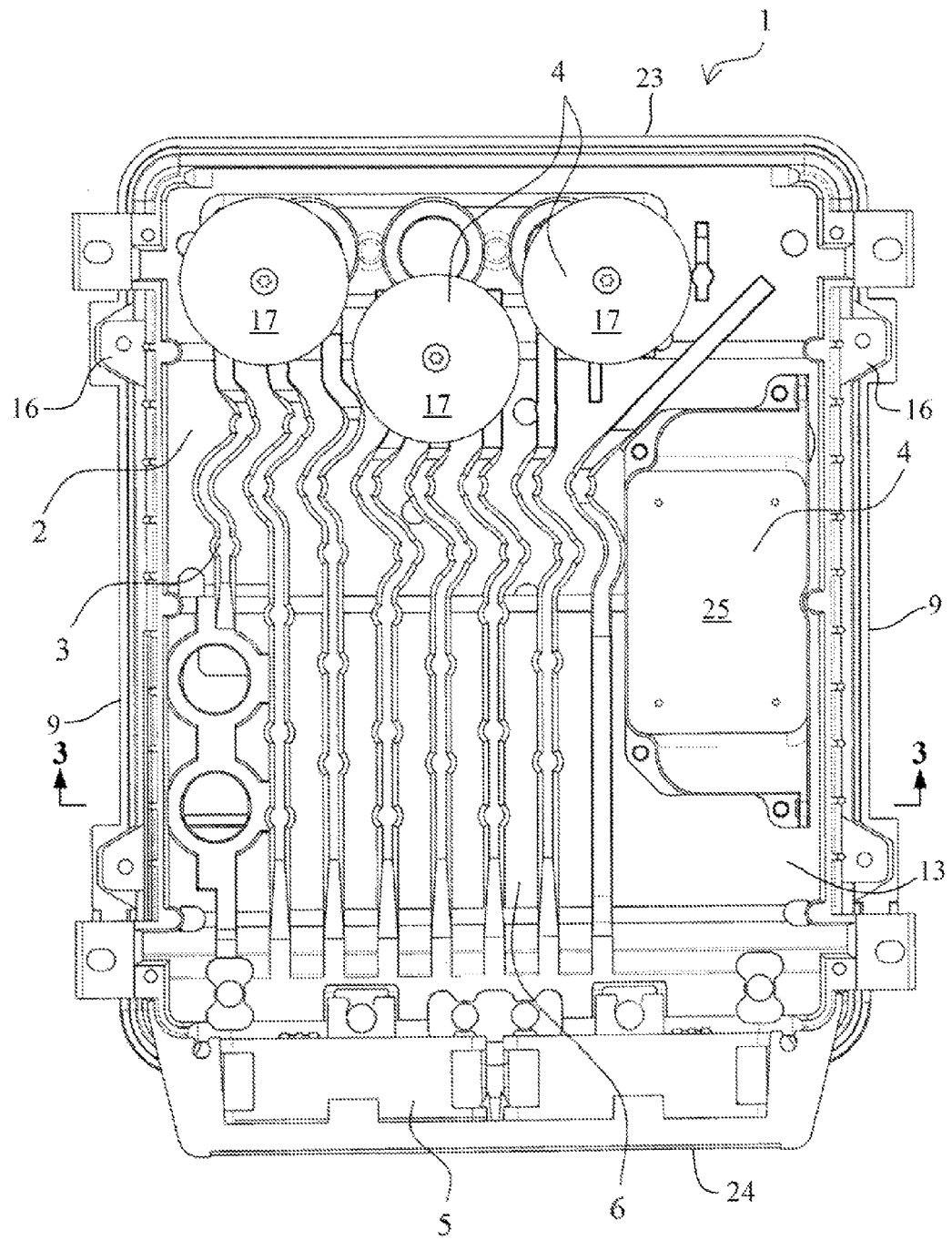

The invention concerns an enclosure (hereinafter a "unit") incorporating electronic components, which produce considerable quantities of waste heat (hereinafter "heat") when in operation. To dissipate this heat the unit is furnished with a plurality of cooling fins or ribs.

STATE OF THE EXISTING TECHNOLOGY

As is already known, a predominate number of electronic components produce considerable amounts of heat during operation. This heat should be advantageously dissipated into the ambient environment. Electronic, load carrying elements, such as transistors or impedances produce especially great quantities of heat.

Importantly, if a multiplicity of electronic components is applied within a tight enclosure without atmospheric circulation so that protection is provided to combat undesirable environmental properties including humidity and air-borne dust the generated heat, can produce high temperatures in the immediate area of circuitry. An increase in temperature degrades the efficiency of the circuit elements, cuts down the operating life of components or, in some cases, can destroy the electronic component itself.

A conventional practice in providing cooling means for the avoidance of overheating may include the formation of ribs in the unit which carries the electronic component for the pickup and radiation of heat. Resulting from the placement of such ribs, a unit must be must be of such a character, that on an inner section a heat producing electronic component is present and on a section distant therefrom, cooling ribs be installed. In this type of manufacture, generated heat is transferred to cooling ribs and is dissipated into the surrounding air.

To develop a solution to unwanted heat, EP 1 996 004 A1 proposes added components designed for more rapid heat dissipation. These additions are in the form of coils, which are inserted into separated areas of the unit and are simultaneously blocked off from heat transfer to supports of electronic components. EP 1 996 004 A1 is based on an application for a converter, wherein the unit is furnished with indentations to receive the said heat relieving coils. This arrangement restricts heat transfer to sensitive elements. Cooling ribs are installed on an exposed outer section of the enclosing unit to remove heat from the inserted coils. The described separation of elements also provides a lower temperature in the interior of the unit.

The disadvantages of the above described cooling lies in disadvantageous changes in the shape of the unit housing. Manufacturing costs of housings are increased by valley-like indentations and their presence results in a bulky appearance of the finished unit.

DE 10 2004 030 457 A1 discloses another solution, in accord with which, unit housing is divided into two chambers. The first chamber is sealed off and possesses a high degree of protective measures. The second chamber is provided with air passage slits. The electronic operational components employ a partitioning wall between the two chambers as a heat transfer surface. Sensitive electronic components, which are to be guarded from environmental influences, are placed in the first chamber. Other components—here, for instance, self protected electronic components immersed in congealed plastic—are secured in the second chamber. The components of first chamber make use of the partition as a heat transfer means. The separating partition extends into the second chamber. Air slits in the second chamber permit captured heat to escape. This method again results in a lower temperature in the first chamber in spite of the heat of operating components, even though heat is generated in substantial quantities This heat removal system carries inherent disadvantages. The double chamber arrangement contributes to a loss of space otherwise used for ribs. Consequently, optimal cooling of the electronic components in the first chamber cannot be assured.

Further, in the double chamber system, the cooling system and the components in the second chamber, can be subjected to unwanted environmental effects finding entry through air passage slits.

SUMMARIZATION OF THE PRESENT INVENTION

Given the above background, the purpose of the invention is to make available an improved cooling system for electronic components with smallest possible space requirements. In this way, simultaneously, a better protection of the cooling system from undesirable environmental conditions can be achieved.

This purpose is attained by means of the presentation of an invented unit in accord with claim 1. The dependent claims concern advantageous modes of construction of the invention.

The invented unit comprises several electronic components, which, when in operation, generate heat, which is dissipated into the immediately surrounding ambience. As an example, the invented unit could hold a frequency transverter or another kind of electronic converter. This is not a limitation as the invention is applicable for use in other optional electronic circuits.

The invented unit for electronic components includes a carrier plate. On a first section of the carrier plate, in accord with the invention, is to be found a first group of assembled components. Upon a second section are located a second group of electronic components. In a preferred design, the first group incorporates such components as may be sensitive to foreign influences and which are not shielded by individual housings nor are these components distanced from portions of the circuit. To the second group belong electronic components which can generate first, large quantities of heat and also possess high quality, individual protection. For example, superior protection can be achieved if a component is encased in its own individual housing and immersed in insulating, congealed plastic. Thus, for example, converters and other electronic components of the second group can be self-protected against invasion without great expense or effort.

As part of the protective design, the invented unit possesses a housing, which corresponds in dimensioning to the carrier plate. This carrier plate has two sections, which respectively carry installed electronic components. In at least one version, the carrier plate is so positioned in the said housing, that the housing may be spoken of as being in two parts. As an alternative version to this, each section of the carrier plate can be an integral part of the housing. In an alternative design, each section of the carrier plate can form its own housing. In accord with either version, that part of the housing, which is equipped with the first group of electronic components is provided with a high degree of protection to protect the therein installed electronic components from, for example, environmental challenges, humidity and influx of dust. Contrary to this there are frequent instances in which no, or at least minimal protection, such as a special housing, or an additional housing would be found necessary to block the ingress of damaging environmental conditions. Consequently, the second section of the carrier plate, in one version, may be regarded as a part of the outer wall of the housing and, in this state, further protection is not required. Differing from this, a version is available wherein a housing, or part thereof, is equipped with air passage slots. Such slots allow a simple ventilation of the interior and an exit path for heat. In yet another version of the invented unit, even the second group of electronic components is protected by a special housing or part thereof to provide a superior type of protection.

The above described separation of the electronic components into two sections of the carrier plate allows an installation wherein a substantial quantity of heat may be generated by heat-sensitive circuits positioned in that portion of the housing containing a first group of electronic components. Again, this division of situating of the first electronic component group permits a lesser order of environmental protection for heat generated in a single, integral housing. Accordingly, a major expense in time or money is saved by the elimination of a large, common covering for an assembly of electronic components. Other components, for example load transistors, remain within the first group, even though they emit relatively large quantities of heat. The reason for this type of manufacture is that individual housings for separate components is too expensive. Due to placement on the other section of the carrier plate, components of the second group do not contribute heat to increase the temperature of the sensitive circuitry of the first group in the first section of the carrier plate.

In addition to the electronic components of the second group, which are installed on the second section of the carrier plate, a conforming plurality of cooling ribs have been inserted. These ribs, with fitted curvature, are thermally united with the first group, so that these said ribs can withdraw heat also from these first components. In accord with the invention, these cooling ribs extend themselves over either their entire or partial length in a plane parallel to the surface of the carrier plate. The material and the dimensioning of the said cooling ribs is not described here or later in detail, except to the extent that both follow respective conventional standards.

Because of the curving of the cooling ribs, in comparison to straight-line ribs, a more effective cooling result is achieved within the same over-all length. This becomes possible, in that, due to the said curvature of the ribs, flowing air is caused to impact and change direction, so that lamination is broken up and turbulence increased. These properties assure a more effective thermal contact of air against the ribs. Beyond this, the offsets increase the heat conduction surface of the ribs, thus allowing a greater heat exchange to take place. This advantageous effect is common in cases where cooling ribs are fashioned in the curved manner.

Another advantage of the curved cooling ribs can be found, in that this shape offers additional protection against environmental forces for electronic components located on the second section of the carrier plate. The undesirable environmental influx could be rainwater. This is true especially for an advantageous version of the invented unit in which an installation of the protective elements has been so installed so that the ribs, as viewed from that component to be protected, are situated in that direction from which the said environmental influx is expected to flow. To clarify direction, if the invented unit possesses a hanging support, whereby one end forms a "bottom", and the other end is the "top", then the components to be highly protected should find themselves beneath the curves of the ribs. In such a case the rain would not fall on the components beneath a bellied out casing, but would collect itself on the curvatures from which it is easily diverted.

In some variants of the invented unit, the cooling ribs are given an S-shaped curvature, this having two or more directional reverses of equal size in both directions across the longitudinal axis of the said cooling ribs. This type of curving assures an especially effective protection from environmental interferences such as rainwater. For example, rainwater is widely spread out by the double curves and consequently, a large area under the projection of the curves is shielded. Because of the uniformity of an S-shaped curvature, the fabrication of a protective element becomes a simple operation.

In accord with another version, one or more of the narrowed ribs are tapered, so that the length of the cooling ribs in proximity to the carrier plate becomes the greatest dimension, hence, tapering off away therefrom. Thus, tapering is carried out in proximity to the heat-sensitive elements. This incline creates an improvement of the protective action in respect to rainwater. Inflowing rainwater is led by the curves along the cooling ribs to an accumulation point. Otherwise, rainwater would be distributed over the entire height of the ribs, from which it would drop away. The tapered end edges of the cooling ribs are so made and/or the heat sensitive element may be so located, that rainwater bypasses the sensitive elements.

Very often the cooling ribs are arranged in parallel, i.e. disposed at equal distances, one from the other. This is not always the case. Deviations from a parallel arrangement are purposely made to facilitate space requirements. These deviations aid turbulence or serve to direct cooling air through the passages between the ribs in a predetermined, advantageous path. Fortunately, the cooling ribs are so set, that rainwater or another disturbing inflow, which is directed to their location, can be properly captured. Rainwater can be caused to remove itself directly from the air flow passages. This is achieved by an alignment of the size and shape of the curvature regarding the separating distance between the cooling ribs.

In regard to the elements to be protected, one such element can be a fan installation, which directs cooling air along the ribs and thus increases the heat transfer capacity. For example, the fan installation (of one or more fans) is located at the bottom end of a hang mounted carrier plate. Air is blown upward through the now vertical pathways between the cooling ribs.

The cooling ribs are so disposed in relation to the fan installation, as well as being properly situated in respect to one another that, because of the said curvature as well as the tapered construction at either or both ends, protection is gained from rainwater entering from above and falling upon the fan or its motor, both being sensitive elements. Accordingly, the fan is, at least partially, protected from rainwater and damaging environmental forces such as dust entering from above.

In yet another version, for example the cooling ribs, that is to say, some of the cooling ribs are aligned in the direction of one or more components of the second group and protect these in the means and ways described above.

In accord with a preferred version of the invented unit, the components of the second group are placed on external, side sections of the carrier plate. Thus, these components do not interfere with the efficient alignment of the cooling ribs. Simultaneously, heat developed by the components dissipates itself without help into the ambient air. In this way the capacity of the cooling ribs for heat transfer and removal for the first component group is not degraded.

A BRIEF DESCRIPTION OF THE DRAWINGS

Figure 2:
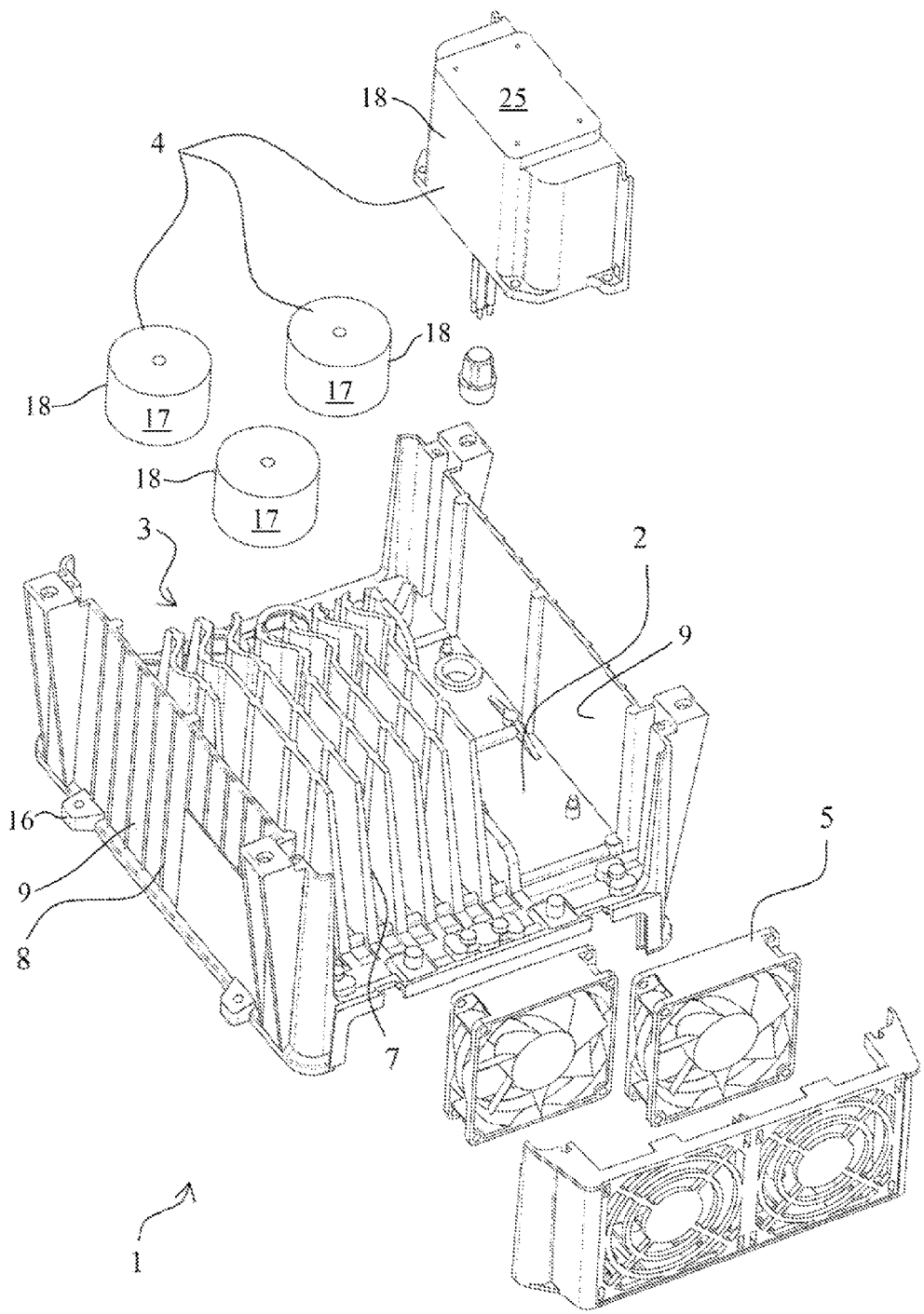
Figure 3:
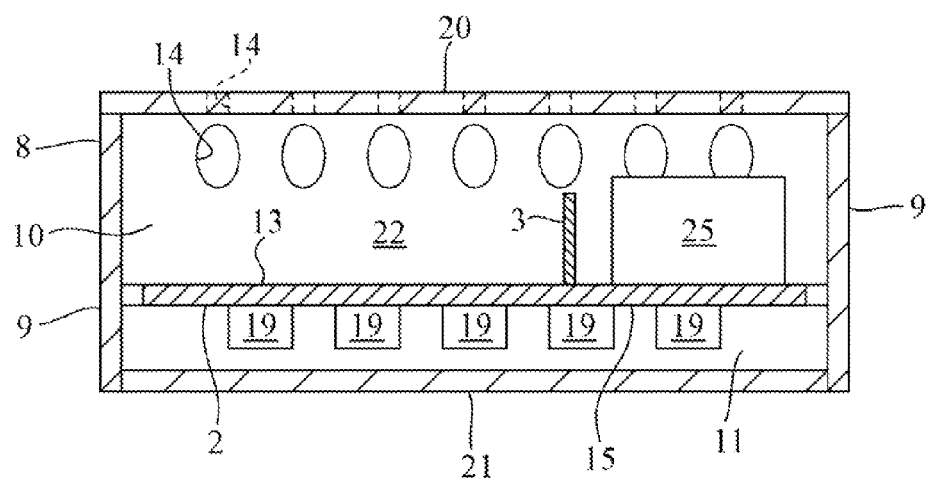

The following Figures describe and explain the invented unit by means of illustrations of approved versions of the same:

FIG. 1 A schematic diagram showing a top view of a carrier plate of an invented version, and FIG. 2 An exploded view of an equipped carrier plate of an invented version; and FIG. 3 A vertical sectional view of the housing enclosing the carrier plate and taken along lines 3-3 of FIG. 1.

DETAILED DESCRIPTION OF THE INVENTION

FIG. 1 shows a top view of a carrier plate 2 of an invented unit 1. The exemplary arrangement comprises a frequency transverter and provides the layout of the second section, which encompasses the cooling ribs. The first section carrying the first group is not shown in this view. Normally, the carrier plate 2, in the illustrated version is protected by a housing 8. Parts of the housing 8 have been omitted in the drawing to enhance clarity; the housing 8 includes a pair of side members mounted on opposite sides of the carrier plate 2. In the following, references to "above" and "below" are in reference to the alignment of FIGS. 1 and 2, which is the alignment of an invented unit in a hanging mode. The carrier plate 2 in the depicted view divides the housing into two halves 10, 11 (see FIG. 3), whereby that half 10, in which the second section 13 of the carrier plate 2 lies, possesses air openings 14 (see FIG. 3) which can be arranged in a circumferential manner or possibly also placed on the upper and the lower sections. These openings assure heat interchange with surrounding ambient air. The other half 11 of the housing, in which the first carrier plate section 15 is found, is designed to be air tight and corresponds to a high order of protection.

The unit 1 shown in FIG. 1 is described in a hanging mode. Each housing side 9 includes a mounting lug 16 having a through hole; the lugs 16 define a device for hung mounting of the housing 8. Such a mounting using the lugs 16 permits the installation of unit 1 on a wall with the arrangement of carrier plate 2 and mounted components remaining unchanged. The drawing of FIG. 1 shows a wall mounting alignment and section 1, as pictured, is in an upward position with an upper or top housing end 23 above a lower or bottom housing end 24 such that gravity urges rainwater or other environmental contaminents entering the housing 8 towards the lower or bottom housing end 24.

In this version, the upper, right area (as per drawing) of the carrier plate 2 supports the electronic components 4 of the second electronic component group. Advantageously, the components 4 are in thermal union with the carrier plate 2. This is accomplished by means of small, evenly spaced pins being placed between component 4 and the carrier plate. This avoids a transfer of heat from these components to the first section of the carrier plate 2.

In the case of the second group of components 4, which are shown as being a generally prismatic component 25 and the components 17 circular in outline, these are sine-wave chokes 17, which, in the case of the frequency transverter, are employed for the production of a sine wave shaping of outgoing voltage, wherein square wave formation is subjected to harmonic tuning. Such choking operations give rise to considerable heat when in operation. Thus, the arrangement of the sealed-off first section 15 of the carrier plate 2 clearly reduces the output of its heat. Generated heat from the second section 13 can easily be removed by air slits 14.

In the case of the version shown, all components 4 of the second group are placed in respective individual housings 18 in a manner compliant with current degrees of protective methods. Briefly, it can be said that a component 4 is encompassed by its own individual housing 18 and is sealed therein by an insulating cast plastic which has congealed. As a result, no damage to the so sealed components can result from subjection to air from the said slits 14.

The cooling ribs 3 run through the middle zone of the carrier plate 2. These are responsible for the removal of heat from the first section 15 of the carrier plate 2. In particular, in the illustrated FIG. 3, are shown the first group of components, which group contains a set of load components 19, for instance Insulated Gate Bipolar Transistors (IGBT's) which are not detailed but are located in the first section 15 of the carrier plate 2. The heat from these devices is conducted through the carrier plate 2 to the cooling ribs 3 and from those, dissipated into the ambient air. For an optimal removal of the heat from the cooling ribs 3, in the lower area of the carrier plate 2, two fans 5 have been installed. The output flow from these fans 5 is so directed against the cooling ribs 3, that the air can move along the ribs from below through the passageways 6, which are interstitially located between the ribs. These air passageways 6 terminate in the illustrated version at the sine wave chokes 17, which also allows the cooling air to flow over these components.

The pictured placement area for the large middle area of the carrier plate 2, which is devoted to the cooling ribs 3 has been made possible by the placement of the components 4 in the edge zones of the carrier plate 2. This arrangement provides an extensive, free running installation of the cooling ribs 3. Thus there is only a minimal heat contribution of the sine wave chokes 17 to the cooling capacity of the cooling ribs 3. This has the result that the quantity of heat which is conducted to and through the cooling ribs 3 can be additionally increased.

As may be seen in FIG. 1, the cooling ribs, in their upper area make a reverse offset in away from and back to their longitudinal axes. These particular ribs (3) which lie above the fans 5 and their motors (not shown) at the lower section of the invented unit 1 lie in a plane parallel to the surface of the carrier plate 2 and possess within this plane, as shown in the illustrated version, an shape with curvatures of approximately equal extent in both directions from and to their longitudinal axes. Counter to this arrangement, in the right hand section of FIG. 1, the cooling ribs 3 are shown as bending in only one direction. This lies, first, within the appointed cooling rib 3 space allotment, and second within the highly necessary protective area spatially located beneath them. Because of this deviant curving of individual cooling ribs 3, these ribs are only partially included in the above said parallel alignment.

In order to attain a complete shielding, especially in regard to rainwater, in the illustrated arrangement, the separating distance of the cooling ribs 3 and consequently the width of the air passages 6 is so dimensioned in respect to the rib curving, that no rainwater from above can migrate directly through the flow passages onto the fans 5. Instead of this, rainwater, which has penetrated inside of the housing, falls on the said S-curves of cooling ribs 3 and consequently flows along these, until it finds an exit path due to the tapered ends 7 of the cooling ribs and removes itself at a preselected point.

Concerning the offset cooling ribs 3 as well as the illustrated version, especially where an invented unit 1 of equal dimensions is concerned, these S-curved ribs, in cooling capacity, exceed straight ribs by 50%. This superiority lies first, in that the forced diversion of path of the cooling air leads to better turbulence and additionally the heat transfer area of the cooling ribs 3 is increased. Alternate versions of the cooling ribs comprise ribs that are curved over their entire length or over a predominate extent thereof. This arrangement further increases the cooling efficiency.

FIG. 2 shows an exploded view of another version of an invented unit 1, whereby the components lying on the first section of the carrier plate 2 are again not shown and, for clarity, parts of the housing 8 are removed. The same reference numbers are used for elements, which correspond to those in FIG. 1.

In spite of the described characteristics of the cooling ribs 3 in FIG. 1, the ribs in FIG. 2 clearly denote the tapered incline of the narrowed end edges proximal to the fans. This tapering is such, that as the height above the carrier plate 2 increases, the overall length of the ribs decreases. This tapered contour permits a conduction of rainwater to a preselected exit in the lower section of the housing 8. Advantageously, the fans 5 are so arranged, that the edges 7 of the ribs divert rainwater from fan motors.

In the exploded view, side parts 9 of the housing 8 are visible. Normally, the housing 8 completely encloses carrier plate 2 with the thereon mounted components. FIG. 3 illustrates the housing 8 formed from the side walls 9, front cover plate 20, back cover plate 21, top cover plate 22 and a bottom cover plate (not shown) opposite the top cover plate 22. To simplify the drawing, only the carrier plate 2, the components 19 and 25 mounted on the carrier plate 2, and one rib 3 are shown in the drawing. The housing 8 completely encloses the carrier plate 2 and cooperates with the carrier plate 2 to define the housing halves 10, 11. In the illustrated embodiment the air openings 14 are formed in the front cover plate 20 and the top cover plate 22. To achieve this, the housing 8, in relation to the carrier plate 2 is in a two-part construction, that is, the housing 8 and the carrier plate 2 cooperate to define the housing halves or compartments 10, 11 that are separated from each other by the carrier plate 2. The so separated housing part 11, in which the first section of the carrier plate 2 is located, possesses a high degree of protective means and, accordingly, is free of air or water intrusion, that is, the portion of the housing 8 defining the housing half 11 is airtight and watertight as previously described and so does not include openings or air passages.

The other housing part, shown as being above that in which the cooling ribs are present, due to air slits, has a lesser degree of protective means.

The other housing part 10, shown as being above that in which the cooling ribs are present, due to air slits 14, has a lesser degree of protective means and would allow environmental contaminants, such as rainwater, to enter the housing half 10.

The invention claimed is:

1. A unit for supporting electronic components which, when in operation, emit heat, said unit comprising:
   one generally planar carrier plate, which, on a first section thereof, a first group of electronic components is installed and on a second section thereof are placed, first, a plurality of cooling ribs for the removal of heat developed by the said electronic components of the first group, each rib extending along a respective longitudinal axis, and second, a second group of electronic components whereby the cooling ribs at least run along their longitudinal axes with predetermined curvatures in a plane parallel to the said carrier plate;
   a device for hung mounting which orients the longitudinal axes of the cooling ribs generally parallel with the force of gravity when the unit is mounted thereby;
   the unit having a top end and a bottom end located with respect to gravity below the top end when the unit is mounted, and the device for hung mounting of the unit is so designed that in the case of rainwater entering the unit the rainwater is urged by gravity towards the bottom end of the unit;
   the ribs defining air passages between adjacent pairs of ribs, the air passages having opposed upper and lower ends, the upper ends above the lower ends when the unit is mounted and the ribs being configured such that no rainwater can run in a straight line from the upper end to the lower end through any one of the air passages without impacting one of the ribs defining the air passage.

2. A unit in accord with claim 1 comprising at least one fan which is so directed at the cooling ribs, that it can impel air to flow through the passages along and between the ribs.

3. A unit in accord with claim 2 wherein the device for hung mounting orients the longitudinal axis of each of the cooling ribs generally parallel with the force of gravity and locates the at least one fan below the cooling ribs when the unit is hung by said device.

4. A unit in accord with claim 2 wherein each air passage is defined by a pair of adjacent first and second ribs, each first and second rib having a curved portion extending along the air passage.

5. A unit in accord with claim 4 wherein the at least one electronic component of the second group is below the curved portions of the ribs when the unit is hung by said device.

6. A unit in accord with claim 1 wherein each rib has a longitudinal length and the ribs are so tapered that the longitudinal length of each cooling rib is reduced in increasing distance from the carrier plate.

7. A unit in accord with claim 6 wherein the device for hung mounting orients the longitudinal axis of the cooling ribs generally parallel with the force of gravity and the ribs each extend from a lower side to an upper side when the unit is hung by said device, the lower side of each rib slanting towards the upper side of the rib in a direction away from the carrier plate.

8. A unit in accord with claim 1 wherein each rib has a longitudinal length dimension and has an S shape along at least a portion of the length dimension.

9. A unit in accord with claim 1 which comprises a housing, which is separated into two parts by the carrier plate.

10. A unit in accord with claim 1 comprising a housing, the carrier plate in the housing, the carrier plate and the housing defining a first housing portion on one side of the carrier plate and a second housing portion on the other side of the carrier plate, the first housing portion being airtight and watertight, all or part of the first housing portion housing said first group of components, all or part of said second housing portion housing said second group of components and said cooling ribs.

11. A unit in accord with claim 1 wherein the unit comprises a housing, the carrier plate in the housing, the carrier plate and the housing cooperatively defining a compartment in which the carrier forms a part of an outer section of the compartment, and air openings opening into the compartment.

12. A unit in accord with claim 1 wherein at least one component of the second group possesses a tightly sealed individual housing within which the said component is encapsulated.

13. A unit in accordance with claim 1 wherein the ribs cover a portion of the carrier plate having an outer perimeter and the components of the second group are located outside of said perimeter.

14. A unit in accordance with claim 1 wherein the components of the second group are in thermal union with the carrier plate.

15. A unit in accordance with claim 1 in which each rib has an upper side adjacent the top end of the unit and extending longitudinally to an opposite lower side adjacent the bottom end of the unit, the unit further comprising one or more fans adjacent the lower sides of the ribs.

16. A unit in accordance with claim 15 in which the lower side of each rib slopes towards the upper side of said rib in a direction extending away from the carrier plate.

17. A unit in accordance with claim 15 in which at least some of the electronic components of the second group are located between the upper sides of the ribs and the top end of the unit.

18. A unit in accordance with claim 15 in which at least some of the electronic components of the second group are located adjacent one rib of the said ribs and are located between the upper and lower sides of the said adjacent one rib.

* * * * *